United States Patent
Goetz

(10) Patent No.: US 11,081,818 B2
(45) Date of Patent: Aug. 3, 2021

(54) METHOD AND SLEEVE FOR CONNECTING POWER-ELECTRONICS STRUCTURAL ELEMENTS AND PRINTED CIRCUIT BOARDS

(71) Applicant: Dr. Ing. h.c. F. Porsche Aktiengesellschaft, Stuttgart (DE)

(72) Inventor: Stefan Goetz, Forstern (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 83 days.

(21) Appl. No.: 16/696,379

(22) Filed: Nov. 26, 2019

(65) Prior Publication Data

US 2020/0169014 A1    May 28, 2020

(30) Foreign Application Priority Data

Nov. 27, 2018   (DE) ............... 10 2018 129 878.1

(51) Int. Cl.
| | |
|---|---|
| *H05K 7/00* | (2006.01) |
| *H01R 12/55* | (2011.01) |
| *H05K 3/32* | (2006.01) |
| *H05K 1/18* | (2006.01) |
| *H01M 10/42* | (2006.01) |

(52) U.S. Cl.
CPC .......... *H01R 12/55* (2013.01); *H01M 10/425* (2013.01); *H05K 1/18* (2013.01); *H05K 3/325* (2013.01); *H01M 2010/4271* (2013.01); *H05K 2201/10037* (2013.01); *H05K 2201/10053* (2013.01); *H05K 2201/10151* (2013.01)

(58) Field of Classification Search
USPC ........................................................ 361/760
See application file for complete search history.

(56) References Cited

U.S. PATENT DOCUMENTS

| | | |
|---|---|---|
| 2005/0134254 A1 | 6/2005 | Roden et al. |
| 2006/0098288 A1 | 5/2006 | Pan et al. |
| 2010/0062329 A1 | 3/2010 | Muis |

(Continued)

FOREIGN PATENT DOCUMENTS

KR   10-1998-0029841   7/1998

OTHER PUBLICATIONS

Korean Office Action dated Jan. 5, 2021.

*Primary Examiner* — Andargie M Aychillhum
(74) *Attorney, Agent, or Firm* — Gerald E. Hespos; Michael J. Porco; Matthew T. Hespos

(57) ABSTRACT

Mechanical and electrical connection is established between a power-electronics structural element and a circuit board. The circuit board has a bore and an electrical contact area encircles the bore. The power-electronics structural element has a mechanical fastening option and an electrical contact area encircles this fastening option at a point to be connected to the circuit board. A cylinder with a head on one end is inserted into the bore of the circuit board to achieve the mechanical connection, and a sleeve formed from an electrically conductive material surrounds the cylinder. Electrical contact areas of the power-electronics structural element and the circuit board are connected electrically by the sleeve. The mechanical connection is formed by an interlocking connection of the cylinder and the fastening option of the power-electronics structural element.

16 Claims, 6 Drawing Sheets

(56) References Cited

U.S. PATENT DOCUMENTS

2013/0059486 A1* 3/2013 Yang .................. H01R 12/55
   439/884
2017/0352847 A1* 12/2017 Klee .................. H01M 10/441
2018/0235071 A1 8/2018 Barrass et al.

* cited by examiner

METHOD AND SLEEVE FOR CONNECTING POWER-ELECTRONICS STRUCTURAL ELEMENTS AND PRINTED CIRCUIT BOARDS

CROSS REFERENCE TO RELATED APPLICATION

This application claims priority under 35 USC 119 to German Patent Appl. No. 10 2018 129 878.1 filed on Nov. 27, 2018, the entire disclosure of which is incorporated herein by reference.

BACKGROUND

Field of the Invention

The invention relates to a method for establishing an electrical and mechanical connection between a power-electronics structural element and a printed circuit board, such as a connection of a battery cell to a printed circuit board for transferring high currents. The invention further relates to a sleeve that implements the electrical connection.

Related Art

Conventional technologies for printed circuit board manufacture are designed for high structural resolution with fine conductor track spacings and are used for transmitting signals at low currents. In contrast, high currents, as occur in modern power-electronics systems, are not possible with the thin photostructured conductor tracks. A traditional manufacturing approach for power-electronics systems provides discrete components and screw-connected busbars. However, this approach is untenable due to the costs of the special components and the installation thereof. This approach also is not well suited for standard interfaces to microelectronic controllers, which usually comprise surface-mounted integrated switching elements and printed circuit boards.

Some printed circuit boards have at least one laid conductor rail or "outlay" that may be composed of copper or aluminum. The conductor rail usually is connected mechanically and electrically to the printed circuit board by one and the same connection. This connection may be a solder connection of the conductor rail onto a surface metallization which is formed lithographically in an etching process. However the laid conductor rail can be connected by pins, for example press-fitting.

Press-fitting and related prior art technologies are not advantageous for establishing a connection of power-electronics circuits for several reasons. First, the current would have to flow from the laid conductor rails into the printed circuit board and/or the press-fitting element to be discharged from there to the outside. However, for currents of several hundred amperes, a customary contact barrier at a respective boundary surface already is very lossy. Second, press-fitting elements that have been used to date require installation space, in particular installation height, for example for threaded bolts. This space requirement makes it difficult or impossible to lead a required cooling arrangement, for example a cooling plate, across a thin gap pad directly or indirectly to the conductor rail and/or structural power elements on the printed circuit board since a uniform surface without varying installation heights of the structural elements is required for this purpose. A conventional screw arrangement or a pressed-in, fitted bolt would have to be provided at a point in a surface region of the cooling plate and, among other things, milled out there. This would entail enormous costs in a product that is intended for series manufacture. Furthermore, establishing a connection indirectly by press-fitting is not expedient since current of high current intensity should be supplied or discharged to/from the conductor rails or a cable as directly as possible. In a large number of automotive systems, connections are supplied perpendicularly to the printed circuit board. A contact between a current supply and a laid conductor rail should be as direct as possible and not be passed through further intermediate pieces, for example by means of a plated-through hole produced by press-fitting, in the printed circuit board.

A further connection option to conductor rails that run on the top side of the printed circuit board is a current supply from the bottom side of the printed circuit board, with the current supply passing through the circuit board. However, this procedure has the problem of low or at least limited mechanical strength since the current supply continuously pushes the conductor rail away from the printed circuit board over the course of time in the event of vibrational loading, as occurs in a moving motor vehicle that uses power-electronics systems of this kind. In this case, the connection can become fragile and break.

Printed circuit boards with outlay busbars or embedded inlay busbars can make a connection with the respective busbars by screwing starting from a thickness of approximately 1 mm. An insulated printed circuit board can be formed from glass fiber-reinforced epoxy resin, so-called prepreg. This material would begin to flow into the regions that are subject to pressure owing to the screw arrangement. The resin is removed from these regions in the case of inlays, and the screw arrangement is driven directly into the inlay. If there is no reinforcement by a busbar in or on the printed circuit board, the pressure can be diverted from the prepreg onto dimensionally stable metal by a metal sleeve. This is shown, for example, in US 2005/0134254 A1 where the screw is passed through a kind of sleeve.

US 2018/0235071 A1, shows conductive layers connected to one another by a conductive sleeve via a screw and relates overall to an assembly of a power-electronics controller of an electric motor. The screw is passed through the sleeve and driven into a lowermost layer composed of a composite material.

Battery cells often contain threaded bolts or blind holes with internal threads to define a contact area that encircles the bolt or the hole. A screw is screwed into a blind hole of a respective pole of a plurality of battery cells, for example in US 2010/0062329 A1, to connect the battery cells in series by means of a connecting frame. In this case, a battery current is passed through the respective screw onto connecting rails of the connecting frame.

Against this background, an object of the invention is to provide a method for connecting power-electronics structural elements and printed circuit boards to establish both a mechanical and an electrical connection so that high currents can be transmitted and an associated thermal expansion does not influence the strength of the mechanical connection and consequently adversely affect the electrical connection. A further objective is to provide a system with a connection created or established in accordance with the presented method.

SUMMARY

The invention relates a method for establishing a mechanical and an electrical connection between a power-electronics structural element and a printed circuit board. The method uses a first component that creates the mechanical connection and a second sleeve-like component that creates the electrical connection. A bore and an electrical contact area that encircles the bore are introduced into the printed circuit board. The first component is an elongate cylinder with opposite first and second ends. A head is on the first end and the second end is inserted longitudinally into the bore of the printed circuit board. A part of the power-electronics structural element that is to be connected mechanically and electrically to the printed circuit board has a mechanical fastening option with an electrical contact area that encircles this fastening option. The second component is formed from an electrically conductive material and surrounds the elongate cylinder of the first component in the manner of a sleeve. The electrical contact area of the power-electronics structural element and the electrical contact area of the printed circuit board are electrically contact-connected to one another by the second component. The mechanical connection is formed by an interlocking connection of the first component and the fastening option of the power-electronics structural element. The electrical contact-connection is also created by the second component through the mechanical connection of the power-electronics structural element and the printed circuit board by means of the first component.

The printed circuit board may have a metal inlay at the location of the bore, with the bore and the first component being passed through the metal inlay. The electrical contact area that encircles the bore can also be a metallized layer on the bottom side of the printed circuit board when the first component is passed through the bore from above.

The method may provide for a low structural height on a side of the printed circuit board on which the head of the first component rests.

In accordance with the method, a material is selected for the first component without taking into account an electrical conductivity. The first component executes, together with the fastening option of the power-electronics structural element, contact-pressing of the power-electronics structural element onto the printed circuit board. This first component need not have any electrical properties and can be selected without regard to electrical conductivity. For example, copper has a high electrical conductivity but, owing to its easy deformability in comparison to steel, is of only limited use as a fastening element. Thus, comparatively poorly conductive steels can be selected as the material for the first structural component.

The fastening option of the power-electronics structural element may be a bolt and the elongate cylinder of the first component may be a hollow cylinder.

The fastening option of the power-electronics structural element may be a a blind hole and the elongate cylinder of the first component may be a bolt.

The interlocking connection may be achieved by a screw, a rivet, solder, or adhesive bonding.

When the selected interlocking connection is a screw, a thread is arranged on the fastening option of the power-electronics structural element. If the fastening option is a bolt, an external thread is cut on the bolt. Accordingly, an internal thread is cut in the elongate cylinder of the first component, and the elongate cylinder is a hollow cylinder. If the fastening option is a blind hole, an internal thread is cut into the blind hole. Accordingly, an external thread is cut into the elongate cylinder of the first component, and the elongate cylinder may be a bolt. The head of the first component may be configured for connection to a turning tool. The connection may be, for example, a slot connection, a crosshead connection, an internal Allen-type connection, a Torx-type connection or the like.

A further component may be provided to distribute a bearing force and can be a washer arranged between the head of the first component and the electrical contact area of the printed circuit board that encircles the bore. The bearing force that is exerted by a chin of the head directly onto the printed circuit board can occur to such an extent in the case of vibrational loading that a strength of the printed circuit board at the location of the bore and the electrical contact area that encircles the bore is subjected to loading beyond a loading limit, for example in respect of plastic deformation or a flow limit. Thus, the bearing force can be distributed by a washer by way of increasing the size of the area taken up by the chin.

The vibrational loading can occur during operation of a motor vehicle, such as an electric car, and the connection can be established between a battery cell, as part of a traction battery, and a power-electronics circuit used for motor control.

The power-electronics structural element may be a battery cell or a contactor or a further power-electronics structural element designed for high current transfer.

The second component may be a sleeve with an L-shaped lug for a sensor.

The invention also relates to a sleeve for establishing an electrical connection between a power-electronics structural element and a printed circuit board. The sleeve may be a first component that creates a mechanical connection as well as a second component that creates the electrical connection. A bore and an electrical contact area that encircles the bore are introduced into the printed circuit board. The first component may be an elongate cylinder with opposite first and second ends. A head may be on the first end and the second end may be inserted longitudinally into the bore of the printed circuit board. A part of the power-electronics structural element that is to be connected mechanically and electrically to the printed circuit board may have a mechanical fastening option with an electrical contact area that encircles this fastening option. The sleeve is formed from an electrically conductive material and is configured to enclose the elongate cylinder of the first component in the manner of a sleeve and electrically contacts-connects the electrical contact area of the power-electronics structural element and the electrical contact area of the printed circuit board. The mechanical connection may be formed by an interlocking connection of the first component and the fastening option of the power-electronics structural element. Finally, the sleeve is configured to create the electrical contact-connection through the mechanical connection of the power-electronics structural element and the printed circuit board by means of the first component.

Electrical conduction takes place in the sleeve. The sleeve is formed, for example, from brass or preferably from copper or copper that is plated, for example with nickel or tin. The sleeve can form an L-shaped cross-sectional shape or L-rotational body shape that runs radially to the inside or to the outside to define a contact area that is increased in size. Irrespective of a selected form of the interlocking connection between the first component and the power-electronics structural element, such as a screw arrangement by means of a respectively arranged screw thread for example, the sleeve of the invention does not require a thread. A minimum requirement is merely a degree of plastic deformability that is not excessively high in an approximate pressure region. Depending on requirements, the sleeve can have further connections or a, for example welded-on, metal rail component.

The sleeve may have an L-shaped lug for a sensor. The sensor can serve, for example, for voltage measurement of a battery cell since a kind of Kelvin connection, that is to say four-conductor measurement, is rendered possible by the sleeve with the lug since a load current from the battery cell flows through a main body, that generates resistive and inductive voltage drops of the sleeve to the printed circuit board, but not through the L-shaped projection of the sleeve.

Further advantages and refinements of the invention can be found in the description and the appended drawings.

The features mentioned above and those explained below can be used not only in the respectively indicated combination and in other combinations or on their own, without departing from the scope of the invention.

DETAILED DESCRIPTION

Figure 1:
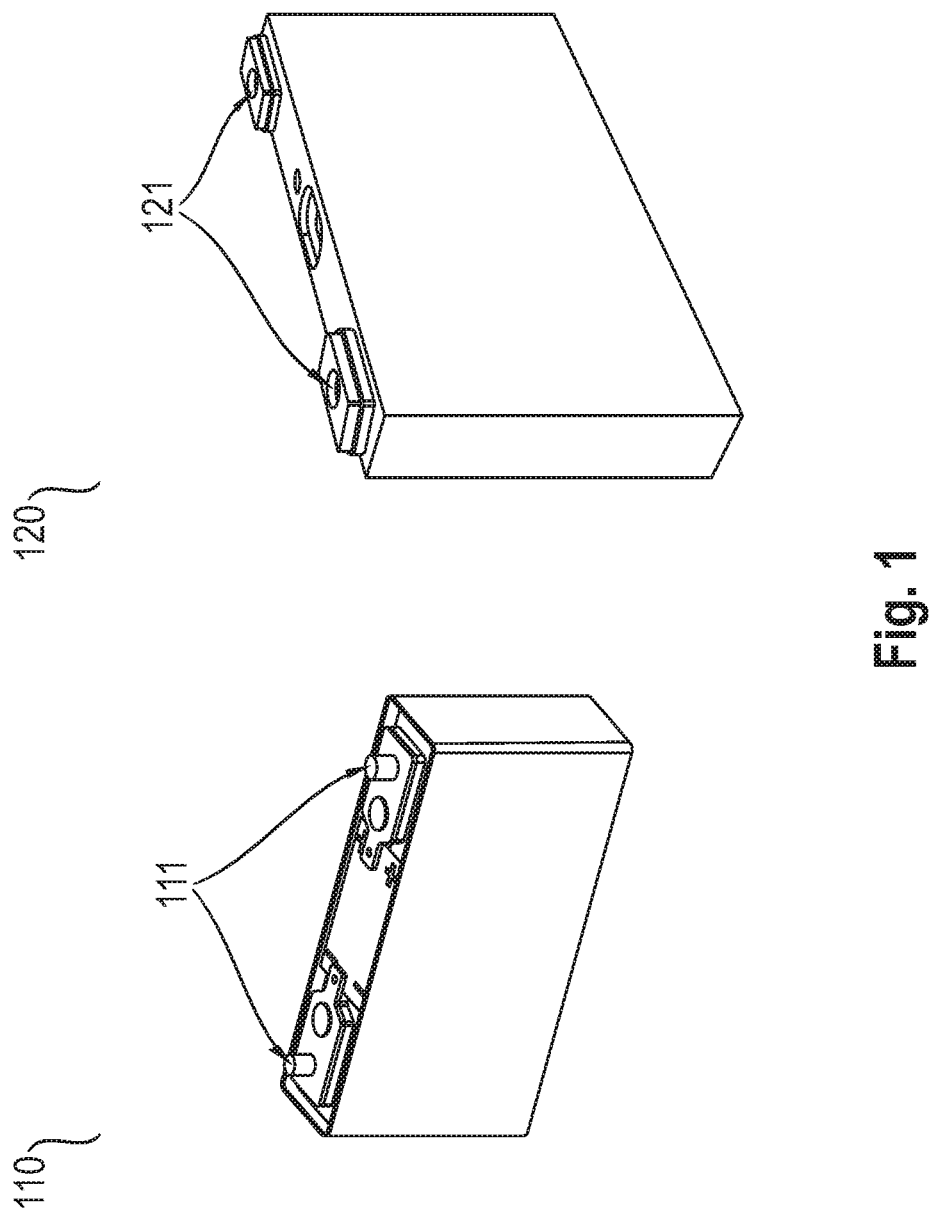
FIG. 1 schematically shows two battery cells from the prior art, each with a connection of the poles by a bolt or by a blind hole.

FIG. 1 schematically shows two battery cells 110, 120 from the prior art, each with a connection of the poles by a bolt 111 or by a blind hole 121. A respective fastening element is formed by the respective bolt 111 or the respective blind hole 121. The fastening element forms an interlocking connection with the first component when executing an embodiment of the method according to the invention.

Figure 2:
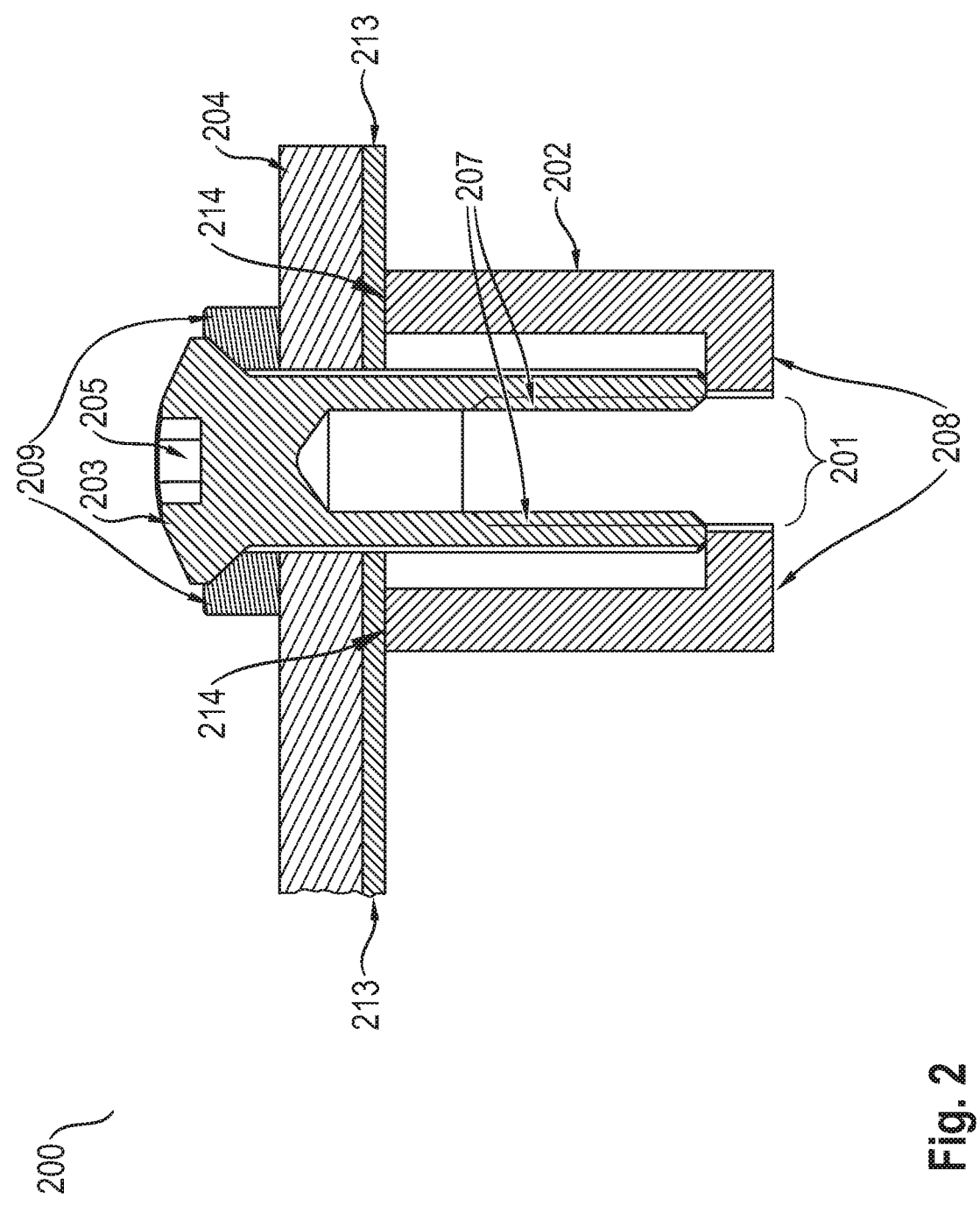
FIG. 2 schematically shows a sectional illustration through components which are arranged according to the invention in line with one embodiment of the method according to the invention.

FIG. 2 schematically shows a sectional illustration 200 through components 202, 203, 204 that are arranged according to one embodiment of the method according to the invention. The first component 203 is passed through a bore of a printed circuit board 204. The first component has a head 205 with a connection for a turning tool and is pressed onto a washer 209 so that a force can be transmitted to a top side of the printed circuit board 204. The first component 203 is composed of mechanically stable material that does not have to be electrically conductive. An elongate formation of the first component 203 is a hollow cylinder with an internal thread 207. The hollow cylinder forms a receptacle 201 for a fastening option to a power-electronics structural element that can be a battery cell. The printed circuit board 204 has a metal layer 213 on a bottom side. A sleeve 202 has an upper contact area 214 that is pressed against the metal layer from below. The sleeve 202 has an L-shape toward the inside so that a lower contact area 208 to a power-electronics structural element is increased in size. The sleeve 202 is formed from a highly electrically conductive material, for example copper. The sleeve 202 does not serve to provide mechanical connection strength. Thus, the highly electrically conductive material selected can also be a material that is easily deformable in comparison to, for example, steel. The sleeve 202 is pressed against the printed circuit board 204 by an interlocking connection of the first component 203 and the fastening option of the power-electronics structural element. The fastening option is a bolt in this case. Owing to the interlocking connection, the power-electronics structural element presses against the lower contact area 208 of the sleeve 202, as a result of which the sleeve 202 is pressed against the printed circuit board 204.

Figure 3:
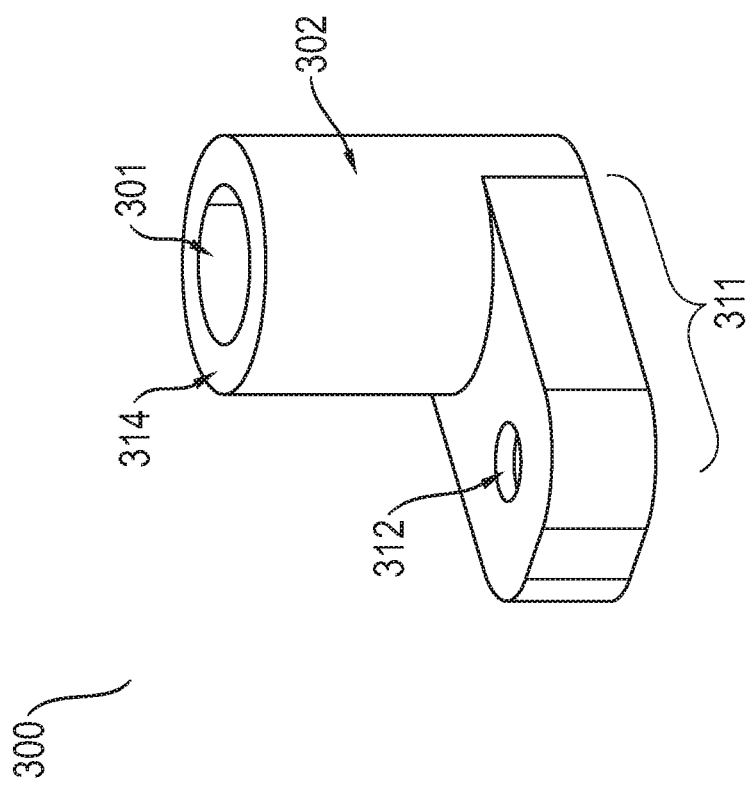
FIG. 3 schematically shows a sleeve with an L-shaped lug for a sensor in one refinement of the sleeve according to the invention.

FIG. 3 schematically shows a sleeve illustration 300 with an L-shaped lug 311 to form a receptacle 312 of a sensor in one refinement of the sleeve 302 according to the invention. According to the invention, the first component is passed into the hollow space 301 of the sleeve 302 from above. The first component, owing to the interlocking connection with a power-electronics structural element pressing against the sleeve from below, pressing the sleeve, by way of its contact area 314, up against the printed circuit board.

Figure 4:
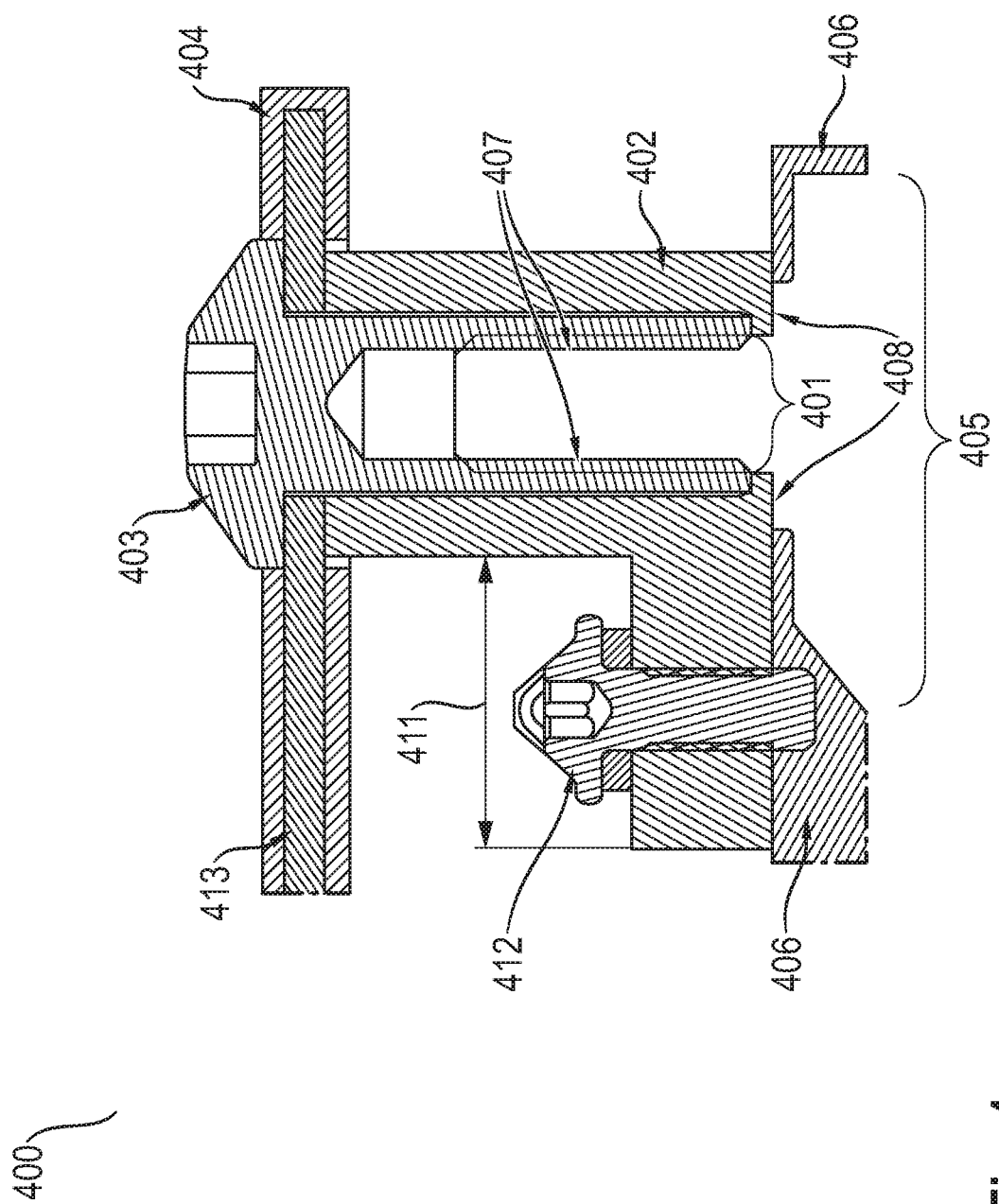
FIG. 4 schematically shows a sectional illustration through a connection which is established according to the invention in line with one embodiment of the method according to the invention.

FIG. 4 schematically shows a sectional illustration 400 through a connection according to one embodiment of the method of the invention. The first component 403 has a head with a chin that presses directly onto an inlay 413 of a printed circuit board 404 from above and has a hollow cylinder with an internal thread 407, a receptacle 401 of a bolt-like pole connection with an external thread. A sleeve 402 has a contact area 408 to a pole cap of a battery cell and is pressed against the inlay 413 from below and therefore establishes electrical contact between the battery cell and the inlay 413. The sleeve 402 further sits on a battery cell frame 406 that is designed to form a receptacle 405 of the pole cap. Finally, the sleeve 402 has an L-shaped lug 411 with a connection for a sensor 412. The sensor 412 can be formed, for example, by a cell measuring contact for a battery management system and can be arranged in the L-shaped lug 411 by riveting.

Figure 5:
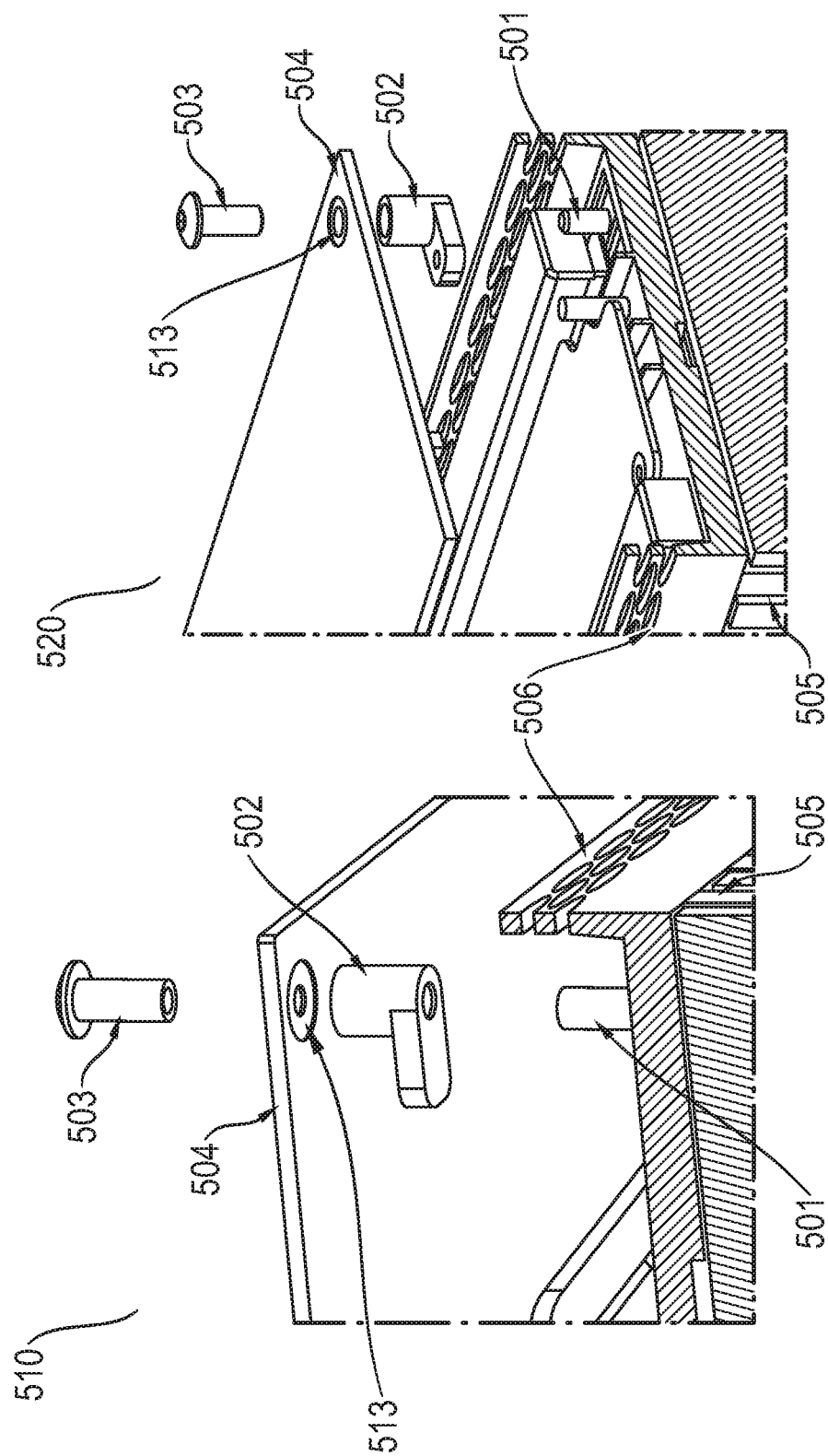
FIG. 5 shows exploded illustrations of the connection process according to the invention in one embodiment of the method according to the invention.

FIG. 5 shows the connection process according to the invention in an exploded illustration 510 from below and in an exploded illustration 520 from above in one embodiment of the method according to the invention. The sleeve 502 according to the invention, the printed circuit board 504 with a contact area 513 that is stripped of insulation and runs around a bore, and the first component 503 are mounted or screwed onto the pole connection 501 of a battery cell 505 with a fitted battery cell frame 506.

Figure 6:
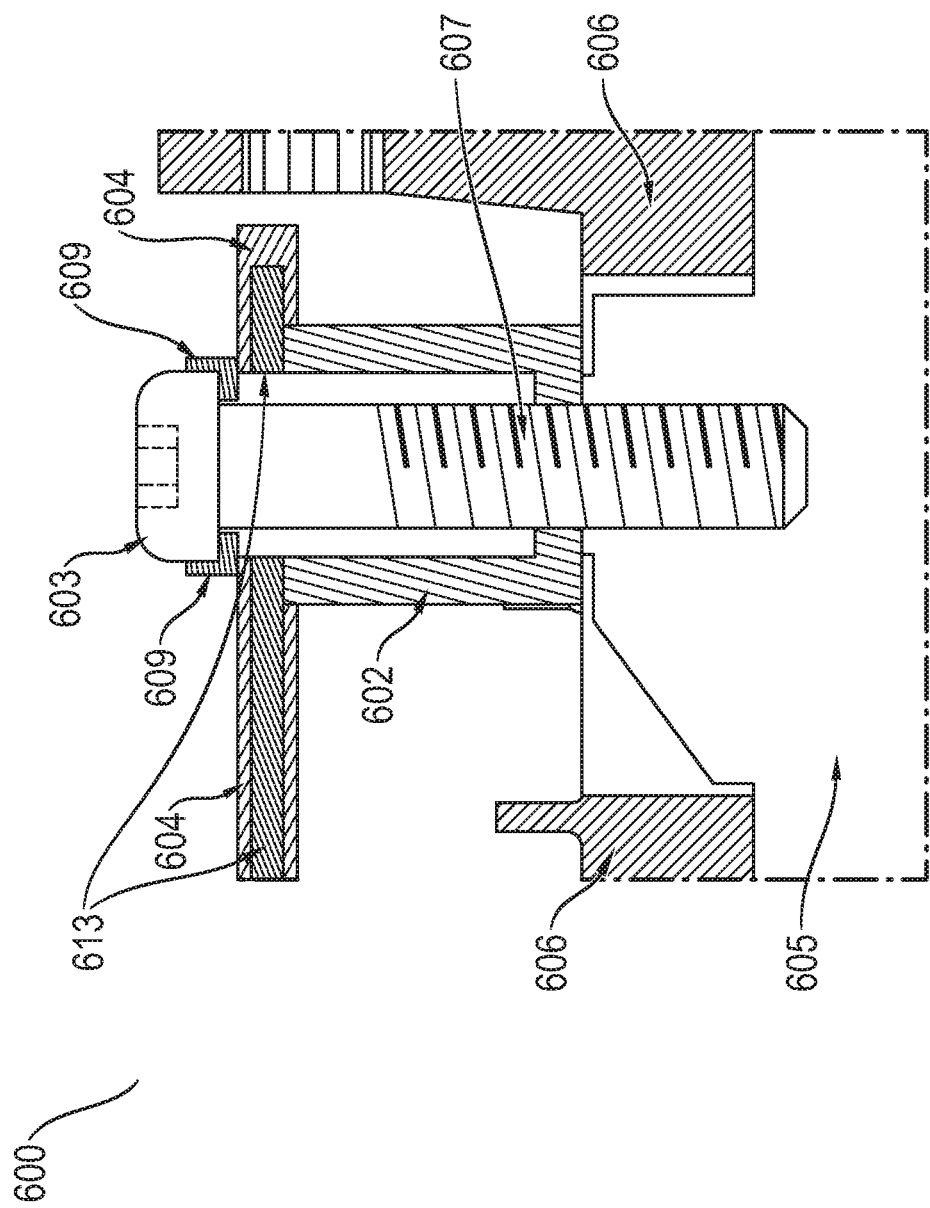
FIG. 6 schematically shows a sectional illustration through a connection which is established according to the invention and has a bolt-like first component in one embodiment of the method according to the invention.

FIG. 6 is a schematic sectional illustration 600 through a connection that is established according to the invention and has a bolt-like first component 603 according to one embodiment of the method according to the invention. The first component 603 presses, by way of its head, onto a washer 609 onto a printed circuit board 604 from above and is, embodied as a bolt with an external thread 607, screwed directly into a blind hole of a pole cap 605, as a result of which a sleeve 602 according to the invention which is located between the pole cap 605, the battery cell frame 606 and the inlay 613 in the printed circuit board, establishes the electrical contact between the pole cap 605 and the inlay 613.

What is claimed is:

1. A method for establishing a mechanical and an electrical connection between a power-electronics structural element and a circuit board, the power-electronics structural element having a mechanical fastening option at a point that is to be connected mechanically and electrically to the circuit board and an electrical contact area that encircles the mechanical fastening option, the method comprising:
  introducing a bore into the circuit board;
  providing an electrical contact area that encircles the bore;
  providing a first component having a head at one end and an elongate cylinder projecting from the head to create the mechanical connection;
  inserting the elongate cylinder of the first component into the bore of the circuit board;
  providing a second component formed from an electrically conductive material;
  positioning the second component to surround the elongate cylinder of the first component so that the second component is positioned for electrical contact-connection to the electrical contact area of the power-electronics structural element and to the electrical contact area of the circuit board;
  mechanically interlocking connecting the first component to the fastening option of the power-electronics structural element, and thereby urging the second component into the electrical contact-connection with the power-electronics structural element and the circuit board.

2. The method of claim 1, wherein the first component is formed from a material with lower electrical conductivity than the second component.

3. The method of claim 1, wherein the fastening option of the power-electronics structural element is a bolt and the elongate cylinder of the first component is a hollow cylinder.

4. The method of claim 1, wherein the fastening option of the power-electronics structural element is a blind hole and the elongate cylinder of the first component is a bolt.

5. The method of claim 1, wherein the step of mechanically interlocking connecting the first component to the fastening option of the power-electronics structural element comprises providing one of a screw connection, a rivet connection, a solder connection and an adhesive bonding connection.

6. The method of claim 1, further comprising providing a washer between the electrical contact area that encircles the bore of the circuit board and the head of the first component to distribute a bearing force.

7. The method of claim 1, wherein the power-electronics structural element is a battery cell, a contactor or a further power-electronics structural element that is designed for high current transfer.

8. The method of claim 1, wherein the second component is a sleeve formed with an L-shaped lug for a sensor.

9. A mechanical and electrical connection between a power-electronics structural element and a circuit board, the circuit board having a bore and an electrical contact area encircling the bore, the power-electronics structural element having a mechanical fastening option at a point that is to be connected mechanically and electrically to the circuit board, the mechanical and electrical connection comprising:
  a first component having a head and an elongate cylinder projecting from the head, the elongate cylinder extending through the bore of the circuit board, areas of the elongate cylinder spaced from the head being configured for achieving mechanical connection to the mechanical fastening option of the power-electronics structural element; and
  a second component formed from an electrically conductive material, the second component having a sleeve surrounding the elongate cylinder of the first component and being configured so that the mechanical connection of the first component to the mechanical fastening option of the power-electronics structural element urges the sleeve into electrical contact-connection with the power-electronics structural element and the circuit board.

10. The mechanical and electrical connection of claim 9, further comprising an L-shaped lug a sensor mounted to the L-shaped lug.

11. The mechanical and electrical connection of claim 9, wherein the first component is formed from a material with lower electrical conductivity than the second component.

12. The mechanical and electrical connection of claim 9, wherein the fastening option of the power-electronics structural element is a bolt and the elongate cylinder of the first component is a hollow cylinder.

13. The mechanical and electrical connection of claim 9, wherein the fastening option of the power-electronics structural element is a blind hole and the elongate cylinder of the first component is a bolt.

14. The mechanical and electrical connection of claim 9, wherein the mechanical connection of the first component to the fastening option of the power-electronics structural element comprises one of a screw connection, a rivet connection, a solder connection and an adhesive bonding connection.

15. The mechanical and electrical connection of claim 9, further comprising a washer between the electrical contact area that encircles the bore of the circuit board and the head of the first component to distribute a bearing force.

16. The mechanical and electrical connection of claim 9, wherein an end of the second component remote from the circuit board has a lower contact portion projecting in from the sleeve and disposed adjacent an end of the elongate cylinder remote from the head of the first component.

* * * * *